(12) United States Patent
Hotta et al.

(10) Patent No.: US 8,642,379 B2
(45) Date of Patent: Feb. 4, 2014

(54) THIN FILM TRANSISTOR

(75) Inventors: Sadayoshi Hotta, Osaka (JP); Jeremy Henley Burroughes, Cambridge (GB); Gregory Lewis Whiting, Menlo Park, CA (US)

(73) Assignees: Cambridge Display Technology Limited, Cambridgeshire (GB); Panasonic Corporation, Oska (JP)

( * ) Notice: Subject to any disclaimer, the term of this patent is extended or adjusted under 35 U.S.C. 154(b) by 27 days.

(21) Appl. No.: 12/524,023

(22) PCT Filed: Apr. 3, 2008

(86) PCT No.: PCT/EP2008/054056
§ 371 (c)(1),
(2), (4) Date: Aug. 18, 2009

(87) PCT Pub. No.: WO2008/122586
PCT Pub. Date: Oct. 16, 2008

(65) Prior Publication Data
US 2010/0084638 A1 Apr. 8, 2010

(30) Foreign Application Priority Data

Apr. 4, 2007 (GB) .................................. 0706655.8

(51) Int. Cl.
*H01L 51/30* (2006.01)
(52) U.S. Cl.
USPC 438/99; 257/40; 257/E51.006; 257/E51.022; 257/E51.025; 438/22; 438/23
(58) Field of Classification Search
USPC ................. 257/668, 724, 778, 779, 780, 786, 257/E23.02, E23.069; 438/106–109
See application file for complete search history.

(56) References Cited

U.S. PATENT DOCUMENTS

| | | | |
|---|---|---|---|
| 5,334,859 A * | 8/1994 | Matsuda | 257/57 |
| 5,723,873 A | 3/1998 | Yang | |
| 5,798,170 A | 8/1998 | Zhang et al. | |
| 6,268,695 B1 | 7/2001 | Affinito | |
| 6,924,503 B2 * | 8/2005 | Cheng et al. | 257/40 |
| 7,390,694 B2 * | 6/2008 | Yamamoto | 438/99 |

(Continued)

FOREIGN PATENT DOCUMENTS

| | | |
|---|---|---|
| EP | 0717446 A2 | 6/1996 |
| EP | 0880303 A1 | 11/1998 |

(Continued)

OTHER PUBLICATIONS

Bernius et al., "Progress with Light-Emitting Polymers," *Adv. Mater.*, 12:1737-1750 (2000).

(Continued)

*Primary Examiner* — Thao Le
*Assistant Examiner* — Sheng Zhu
(74) *Attorney, Agent, or Firm* — Marshall, Gerstein & Borun LLP

(57) ABSTRACT

A method of making a top-gate organic thin film transistor, comprising forming source and drain contacts on a substrate; oxidizing portions of the source and drain contacts; depositing an organic semiconductor layer to form a bridge between the oxidized portions of the source and drain contacts; depositing a gate insulating layer over the organic semiconductor layer; and forming a gate electrode over the gate insulating layer.

19 Claims, 5 Drawing Sheets

(56) References Cited

U.S. PATENT DOCUMENTS

| | | | |
|---|---|---|---|
| 7,399,989 B2 * | 7/2008 | Moriya et al. | 257/40 |
| 2004/0041146 A1 | 3/2004 | Cheng et al. | |
| 2004/0189186 A1 | 9/2004 | Mori et al. | |
| 2005/0057136 A1 * | 3/2005 | Moriya et al. | 313/311 |
| 2005/0263756 A1 * | 12/2005 | Yatsunami et al. | 257/40 |
| 2005/0279999 A1 | 12/2005 | Lee et al. | |

FOREIGN PATENT DOCUMENTS

| | | |
|---|---|---|
| EP | 0901176 A2 | 3/1999 |
| EP | 0947123 A1 | 10/1999 |
| EP | 0949850 A1 | 10/1999 |
| EP | 1508924 A2 | 2/2005 |
| EP | 1852923 A2 | 11/2007 |
| GB | 2348316 A | 9/2000 |
| WO | WO-9810621 A1 | 3/1998 |
| WO | WO-9857381 A1 | 12/1998 |
| WO | WO-99/39393 A1 | 8/1999 |
| WO | WO-9942983 A1 | 8/1999 |
| WO | WO-9948160 A1 | 9/1999 |
| WO | WO-0048258 A1 | 8/2000 |
| WO | WO-0119142 A1 | 3/2001 |
| WO | WO-0181649 A1 | 11/2001 |
| WO | WO-02084759 A1 | 10/2002 |
| WO | WO-2006126363 A1 | 11/2006 |

OTHER PUBLICATIONS

Chu et al., "High-performance organic thin-film transistors with metal oxide/metal bilayer electrode," *Applied Physics letters*, 87:193508 (2005).

Niu et al., "Thermal annealing below the glass transition temperature: A general way to increase performance of light-emitting diodes based on copoyfluorenes," *Applied Physics Letters*, 81:634-636 (2002).

Yamaguchi et al., "Effects of B and C on the Ordering of $L1_0$-CoPt thin films," *Applied Physics Letters*, 79:2001-2003 (2001).

International Search Report and Written Opinion for PCT/EP2008/054056 dated Aug. 6, 2008.

Search Report for Application No. GB 0706655.8, dated Jul. 27, 2007.

Combine Search and Examination Report for Application No. GB 0706655.8, dated Jul. 30, 2007.

* cited by examiner

THIN FILM TRANSISTOR

FIELD OF THE INVENTION

This invention relates to field effect transistors (FETs), particularly organic thin film transistors (OTFTs).

BACKGROUND TO THE INVENTION

Transistors can be divided into two main types: bipolar junction transistors and field-effect transistors. Both types share a common structure comprising three electrodes with a semi-conductive material disposed therebetween in a channel region. Transistors can be formed by depositing the components in thin films to form thin film transistors. When an organic material is used as the semiconductive material in such a device, it is known as an organic thin film transistor.

Field-effect transistors are three-terminal devices which comprise a source contact, a drain contact, and a gate contact. The source and drain contacts are connected by a semiconductive layer (the channel), itself spaced from the gate contact by an insulating layer called the gate dielectric. In polymer transistors, the semiconductive layer is fabricated from a semiconductive polymer, typically a n-conjugated organic polymer. This layer may be deposited in the device by a precursor route or directly by solution-processing.

A voltage is applied across the source contact and the drain contact. Further, a voltage is applied to the gate contact. This voltage creates a field which alters the current-voltage characteristics of the semiconductive layer lying directly under the gate dielectric by causing accumulation or depletion of charge carriers there. This in turn modulates the rate at which charges pass through the channel from the source to the drain contact for a given source-drain voltage.

Therefore, for OTFTs the conductivity of the channel can be altered by the application of a voltage at the gate. In this way the transistor can be switched on and off using an applied gate voltage.

A typical organic light-emitting device comprises two layers of organic material, one of which is a layer of light emitting material such as a light emitting polymer (LEP), oligomer or a light emitting low molecular weight material, and the other of which is a layer of a hole transporting material such as a polythiophene derivative or a polyaniline derivative.

Organic LEDs may be deposited on a substrate in a matrix of pixels to form a single or multi-colour pixelated display, which can be switched between emitting and non-emitting states by altering the current flow through them using a FET. A multicolored display may be constructed using groups of red, green, and blue emitting pixels. So-called active matrix (AM) displays have a memory element, typically a storage capacitor and a FET, associated with each pixel whilst passive matrix displays have no such memory element and instead are repetitively scanned to give the impression of a steady image. Examples of polymer and small-molecule active matrix display drivers can be found in WO 99/42983 and EP 0,717,446A respectively.

An active matrix driven display may be either bottom-emitting or top-emitting. In a bottom-emitting display light is emitted through the substrate on which the active matrix circuitry is fabricated; in a top-emitting display light is emitted towards a front face of the display without having to pass through a layer of the display in which the active matrix circuitry is fabricated.

For good operation, the source-drain materials for OTFT devices must make ohmic contact with the organic semiconductor. Since OTFTs are typically p-channel devices with holes as the majority charge carriers, high work function metals must be used. Examples of standard materials that are used for this purpose are gold, platinum and palladium. While these metals have proved to be very useful, there are downsides to their use, including high cost and diffusion (particularly with gold). For this reason, some examples of source-drain contacts are modified at their surface by the inclusion of an additional layer of metal oxide such as $MoO_3$, $WO_3$ or $V_2O_5$. These types of materials have also been used as hole-injecting contacts for polymer light emitting devices, due to their good energy level matching with the HOMO of light emitting polymers.

US 2005/0263756 is concerned with an organic field effect transistor and a method of manufacturing the same. It is stated that it is an object of US 2005/0263756 to provide an organic field effect transistor in which element characteristics and stability are improved. An organic field effect transistor is disclosed including a gate electrode formed on an organic semiconductor film made of an organic semiconductor material with a gate insulating film interposed therebetween; and a source electrode and a drain electrode formed so as to come in contact with the organic semiconductor film with a charge injection layer made of an inorganic material interposed therebetween, and the organic semiconductor film holes serving as a majority carrier.

US 2005/0279999 relates to a thin film transistor. It is said that there is provided a thin film transistor, which makes electrical communication between source and drain electrodes efficient. There is provided a bottom gate thin film transistor including a substrate, a gate electrode provided on the substrate, a gate insulating layer provided on the gate electrode, and an organic semiconductor layer contacting the source electrode and the drain electrode and insulated from the gate electrode, wherein oxidation portions are provided in portions of the source electrode and the drain electrode that make contact with the organic semiconductor layer. During the method of manufacture of the bottom gate structure described in paragraphs [0034] and [0035], after forming the gate insulating layer, a source and drain electrode layer is formed. Portions of the source and drain electrodes that will, make contact with the organic semiconductor layer (formed later) are oxidised. The gate insulating layer is susceptible to damage by the oxidation process. This limits the choice of oxidation techniques available in this method.

Chu et al Applied Physics Letters 87, 193508 (2005) discloses bilayer source-drain electrodes for organic thin film transistors. The bilayer consists of a transition metal oxide layer ($MoO_3$) and a metal layer. The metal oxide layer directly contacts the organic semiconducting layer and serves as a charge injection layer. The metal layer is coated thereover. The $MoO_3$ of the examples is thermally evaporated directly onto a pentacene active layer film.

It will be appreciated from the above that OTFTs can have complicated structures with numerous layers in a desired layout. Consequently, making these structures involves numerous method steps and techniques. The present invention at least partially aims to simplify existing methods for making OTFTs.

Further, it will be appreciated from the above that there is a problem in this field to develop electrode materials having the necessary deposition and patterning characteristics in combination with the required injection characteristics. In particular, when using the same material for the source and drain electrodes, the material must form good ohmic contacts (achievable by workfunction matching) in the device in order to act as a charge extractor and injector. A further aim of the present invention is to at least partially address this problem.

SUMMARY OF INVENTION

In a first aspect, the present invention provides a method of making a top-gate organic thin film transistor (OTFT), including the steps of:
(a) forming source and drain contacts on a substrate; and
(b) oxidising portions of the source and drain contacts formed in step (a).

In particular, in the first aspect, the present invention provides a method of making a top-gate organic thin film transistor, comprising:
(a) forming source and drain contacts on a substrate;
(b) oxidising portions of the source and drain contacts;
(c) depositing an organic semiconductor layer to form a bridge between the oxidised portions of the source and drain contacts;
(d) depositing a gate insulating layer over the organic semiconductor layer; and
(e) forming a gate electrode over the gate insulating layer.

In one embodiment, the source and drain contacts are oxidised in differing amounts so that the thickness of the source contact oxidised portion is different to the thickness of the drain contact oxidised portion.

In a second aspect, the present invention provides a top-gate organic thin film transistor comprising:
source and drain contacts disposed on a substrate;
an organic semiconductor layer;
a gate insulating layer, disposed on the organic semiconductor layer;
a gate electrode disposed on the gate insulating layer;
characterised in that the source and drain contacts comprise oxidised portions, wherein the organic semiconductor layer is disposed such that it bridges the oxidised portions of the source and drain contacts.

The main principle of this invention is the conversion of a portion of deposited material of the source and drain contacts into one which has improved characteristics for charge injection in organic TFTs.

There are two 'modes' of FET. These are: enhancement, in which a voltage applied to the gate increases the current flow from source to drain; and depletion, in which a voltage applied decreases the current flow from source to drain. The present TFT may be a depletion- or enhancement-type field effect transistor (FET).

In the prior art, a metal oxide has been deposited onto an electrode surface in a separate step, typically by shadow masked thermal evaporation. In contrast, this invention obtains the necessary surface functionality by post-processing of the source and drain contacts. This route is desirable since it enables metals that are simple to deposit and pattern to be used, and then converted to give the necessary injection characteristics. In this regard, the present inventors have, for the first time, separated the necessary deposition and patterning characteristics of the source and drain contacts from the required injection characteristics in device architecture.

In the present invention, by "oxidising" is meant loss of electrons from the source and drain contact material.

The present invention also may be extended to organic light emitting devices (OLEDs). As such, a third aspect of the present invention provides a method for making an anode layer of an organic light emitting device (OLED), including the steps of:
(a) forming an anode on a substrate; and
(b) oxidising portions of the anode formed in step (a).

A fourth aspect of the present invention provides a method for making an OLED, including the steps of:
(a) forming an anode; and
(b) oxidising portions of the anode formed in step (a).

A fifth aspect of the present invention provides an OLED made according to the method of the fourth aspect of the Present invention. The fifth aspect provides an organic light emitting device comprising: (i) an anode; (ii) a cathode; (iii) an electroluminescent layer located between the anode and the cathode for accepting and combining positive and negative charge carriers to generate light; wherein the anode comprises oxidised portions. Preferably, a hole transport layer is located either between the anode and the electroluminescent layer or in the electroluminescent layer.

According to the sixth aspect of the present invention, there is provided method of making a top-gate OTFT and an OLED on a single substrate, including the steps of:
(a) forming source and drain contacts for the OTFT on a substrate;
(b) forming an anode for the OLED on the substrate of step (a); and
(c) oxidising portions of the source and drain contacts and the anode formed in steps (a) and (b).

It will be understood that according to the sixth aspect of the invention, the OTFT and the OLED will be in a so-called side-by-side configuration. Steps (a_) and (b) may be performed in any order or may be performed together. Preferably, the source and drain contacts and anode are formed in a single step.

The remaining architecture of the organic light emitting device will be as known in this art. Specifically, suitable materials and techniques for depositing those materials as desired will be known. Preferred materials for the anode are as discussed herein for the source and drain electrodes.

BRIEF DESCRIPTION OF THE DRAWINGS

The present invention now will be described in more detail with reference to the attached drawings in which:

DETAILED DESCRIPTION OF THE INVENTION

Figure 1:
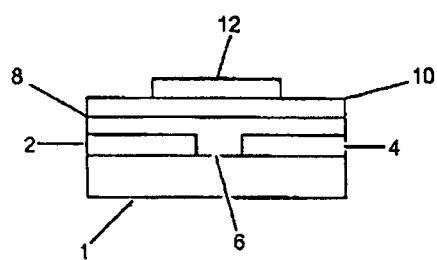
Figure 2:
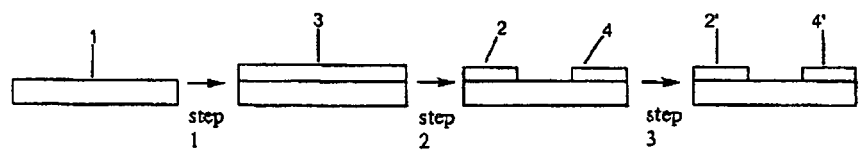
Figure 3:
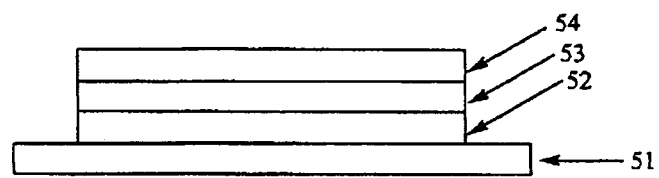
Figure 4:
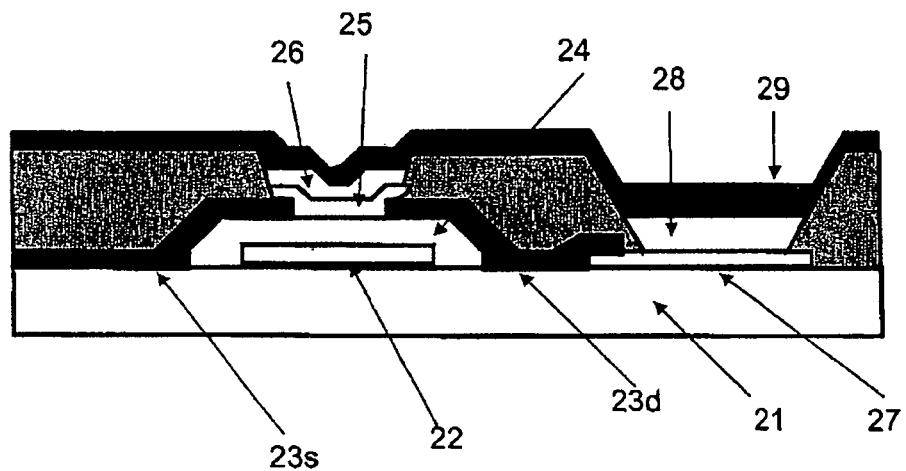
Figure 5:
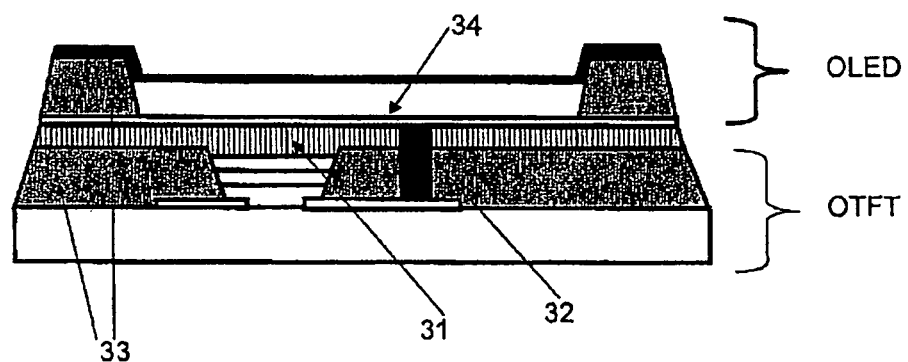
Figure 6:
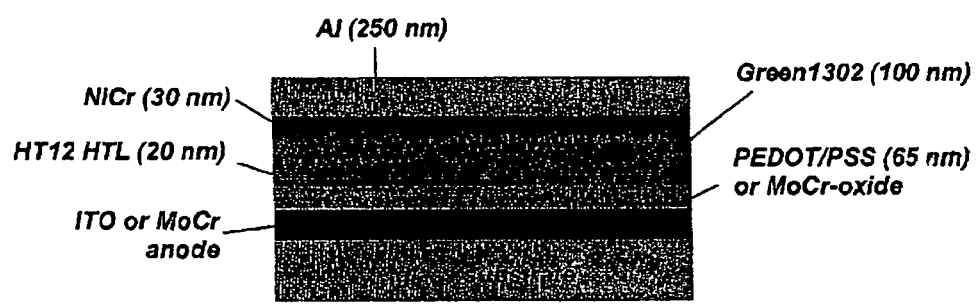
Figure 7:
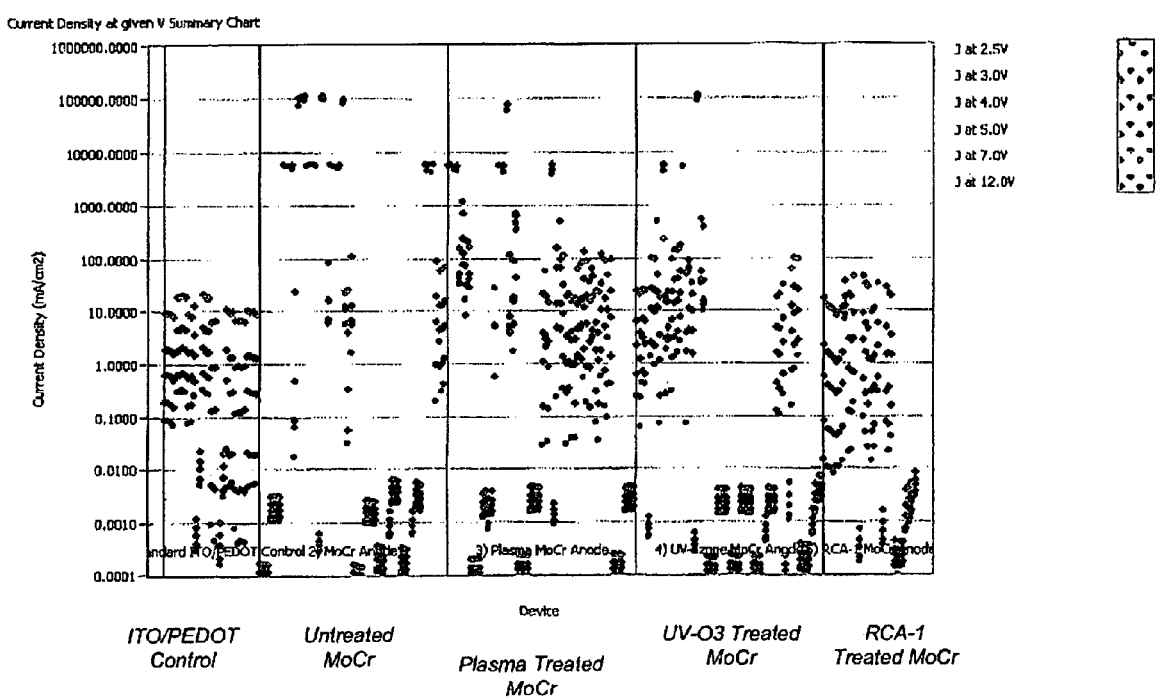

FIG. 1 shows a schematic example of a top-gate OTFT;
FIG. 2 shows an example of the method according to the first aspect;
FIG. 3 shows a schematic example of an OLED;
FIG. 4 shows a pixel comprising an organic thin film transistor and an adjacent organic light emitting device fabricated on a common substrate;
FIG. 5 shows an organic thin film transistor fabricated in a stacked relationship to an organic light emitting device;
FIG. 6 shows the device structure for the tested OTFTs and
FIG. 7 shows current density results for the tested OTFTs.

The illustrated structure of FIG. 1 shows a substrate 1 and comprises source and drain electrodes 2, 4 which are spaced apart with a channel region 6 located therebetween. An organic semiconductor (OSC) 8 is deposited in the channel region 6 and may extend over at least a part of the source and drain electrodes 2, 4. An insulating layer 10 of dielectric material is deposited over the organic semi-conductor 8 and may extend over at least a part of the source and drain electrodes 2, 4. Finally, a gate electrode 12 is deposited over the insulating layer 10. The gate electrode 12 is located over the channel region 6 and may extend over at least a part of the source and drain electrodes 2, 4.

The structure shown in FIG. 1 is known as a top-gate organic thin film transistor as the gate is located on a top side of the device. Alternatively, it is also known to provide the gate on a bottom side of the device to form a so-called bottom-gate organic thin film transistor.

Step 1 of FIG. 2 shows deposition of a metal layer 3 on a substrate. Step 2 shows patterning of the metal layer to form the source and drain contacts 2,4. In step 3, the surfaces of the source and drain contacts are oxidised to form a thin oxide layers 2' and 4'.

Advantageously, according to the present invention, the oxidising of portions of the source and drain contacts takes place in the absence of the gate insulating layer. This means that the integrity of the gate insulating layer is not affected by the oxidising step. Advantageously, according to the present invention, the oxidising of portions of the source and drain contacts takes place in the absence of the organic semiconductor layer. This means that the integrity of the organic semiconductor layer is not affected by the oxidising step.

Upon oxidation, the workfunction of the portions of the source and drain contacts is altered to be more favourable for charge injection. Typically, the portions comprise the upper surfaces of the source and drain contacts.

Typically, the source and drain contacts as deposited comprise one or more metals. There is an energy barrier to charge injection associated with the deposited metal. Upon oxidation, the upper surface of the metal is altered to be favourable for charge injection. It is neither necessary nor preferable to oxidise the entire metal layer, since this would lead to loss of conducting properties. Surface modification is preferable.

Any suitable oxidising process may be used. In the case where the source and drain contact comprise a metal suitable oxidising processes include, for example, the metal forming an oxygen compound and the metal forming a fluorine compound (fluorination). Suitable oxidising techniques include oxygen plasma treatment, UV—$O_3$ treatment, heat treatment, and wet methods such as RCA-1. The skilled person will be able to determine the application of these techniques to obtain the desired degree of oxidation in the present invention e.g. treatment times, intensity etc. However, the present inventors have found 10 minute UV—O3 treatment; 10 minute oxygen plasma (3 kW) treatment; and 1 minute RCA-1 clean to be particularly useful.

The thin film transistor may include a bank structure. In one embodiment, the oxidising step may also alter the wettability of a previously formed bank structure present in the device.

The source and drain contacts formed in step (a) typically have the same thickness. The source and drain contacts formed in step (a) preferably have a thickness in the range of 5 nm to 200 nm, preferably 30 nm to 100 nm, more preferably about 50 nm. Thicknesses may be measured according to standard techniques known in this art, for example Atomic Force Microscopy (AFM).

The source and drain contacts preferably are formed by techniques known in the art.

The organic semiconductor layer is p-type or n-type. In a p-type material, electric charges are carried mainly in the form of electron deficiencies called holes. In an n-type material, the charge carriers are primarily electrons. Preferably, the organic thin film transistor is of a p-type. Ambipolar devices, i.e. devices that can function as n- or p-type, are also known.

For a p-channel TFT according to this invention, preferably the source and drain contacts deposited in step (a) comprise a high workfunction metal with a workfunction of greater than 3.5 eV, for example gold, platinum, palladium, molybdenum, tungsten, chromium or vanadium. More preferably, the metal has a workfunction in the range of from 4.5 to 5.5 eV. Other suitable compounds, alloys, for example alloys of molybdenum such as MoCu and MoCr, alloys of silver such as APC (silver-palladium-copper) and oxides such as molybdenum trioxide and indium tin oxide may also be used. The source and drain electrodes may be deposited by thermal evaporation and patterned using standard photolithography and lift off techniques as are known in the art.

Alternatively, conductive polymers may be deposited as the source and drain electrodes. An example of such a conductive polymers is poly(ethylene dioxythiophene) (PEDCT) although other conductive polymers are known in the art. Such conductive polymers may be deposited from solution using, for example, spin coating or ink jet printing techniques and other solution deposition techniques discussed above.

For an n-channel TFT according to this invention, preferably the source and drain contacts deposited in step (a) comprise a metal having a workfunction of less than 3.5 eV, for example calcium or barium or a thin layer of metal compound, in particular an oxide or fluoride of an alkali or alkali earth metal for example lithium fluoride, barium fluoride and barium oxide. Alternatively, conductive polymers may be deposited as the source and drain electrodes.

The source and drain electrodes are preferably formed from the same material for ease of manufacture. However, it will be appreciated that the source and drain electrodes may be formed of different materials for optimisation of charge injection and extraction respectively.

The length of the channel defined between the source and drain electrodes may be up to 500 microns, but preferably the length is less than 200 microns, more preferably less than 100 microns, most preferably less than 20 microns.

A metal used for the source-drain contacts advantageously may also be used for the anode of an associated organic light-emitting device.

For electron transport, the energy levels of the organic semiconductor layer desirably are matched to the LUMO of the oxidised portions of the source and drain contacts. For hole transport, the energy levels of the organic semiconductor layer desirably are matched to the HOMO of the oxidised portions of the source and drain contacts.

The oxidised portions may comprise MoCr-oxide, $MoO_3$, $WO_3$ or $V_2O_5$ or oxides of Ag, Al or alloy oxides of Al, Ag.

The thickness of the oxidised portions preferably is in the range of 1 nm to 20 nm, preferably 2 nm to 10 nm, more preferably about 5 nm.

The organic semiconductor may be selected according to its ability to accept, conduct, and donate charge. The ability of the organic semiconductor to accept, conduct, and donate holes or electrons can be enhanced by doping the material. The material used for the source and drain contacts can also be selected according to its ability to accept and injecting holes or electrodes. For example, a P-type transistor device can be formed by selecting an organic semiconductor which is efficient at accepting, conducting, and donating holes, and selecting a material for the source and drain contacts which is efficient at injecting and accepting holes from the organic semiconductor. Good energy-level matching of the Fermi-level in the source and drain with the HOMO level of the organic semiconductor can enhance hole injection and acceptance. In contrast, an n-type transistor device can be formed by selecting an organic semiconductor which is efficient at accepting, conducting, and donating electrons, and selecting a material for the source and drain contacts which is efficient at injecting electrons into, and accepting electrons from, the organic semiconductor. Good energy-level matching of the Fermi-level in the source and drain with the LUMO level of the organic semiconductor can enhance electron injection and acceptance.

Preferably, the organic semiconductor layer transports holes. Preferred materials for the organic semiconductor layer include small molecules such as optionally substituted pentacene; optionally substituted polymers such as polyarylenes, in particular polyfluorenes and polythiophenes; and oligomers. Blends of materials, including blends of different material types (e.g. a polymer and small molecule blend) may be used.

The substrate may be rigid or flexible. Rigid substrates may be selected from glass or silicon and flexible substrates may comprise thin glass or plastics such as poly(ethylene terephthalate) (PET), poly(ethylene-naphthalate) PEN, polycarbonate and polyimide.

The gate electrode can be selected from a wide range of conducting materials for example a metal (e.g. gold) or metal compound (e.g. indium tin oxide). Alternatively, conductive polymers may be deposited as the gate electrode. Such conductive polymers may be deposited from solution using, for example, spin coating or ink jet printing techniques and other solution deposition techniques discussed above.

Thicknesses of the gate electrode, source and drain electrodes may be in the region of 5-200 nm, although typically 50 nm as measured by Atomic Force Microscopy (AFM), for example.

The insulating layer comprises a dielectric material selected from insulating materials having a high resistivity. The dielectric constant, k, of the dielectric is typically around 2-3 although materials with a high value of k are desirable because the capacitance that is achievable for an OTFT is directly proportional to k, and the drain current $I_D$ is directly proportional to the capacitance. Thus, in order to achieve high drain currents with low operational voltages, OTFTs with thin dielectric layers in the channel region are preferred.

The dielectric material may be organic or inorganic. Preferred inorganic materials include SiO2, $SiN_x$ and spin-on-glass (SOG). Preferred organic materials are generally polymers and include insulating polymers such as poly vinylalcohol (PVA), polyvinylpyrrolidine (PVP), acrylates such as polymethylmethacrylate (PMMA) and benzocyclobutanes (BCBs) available from Dow Corning. The insulating layer may be formed from a blend of materials or comprise a multi-layered structure.

The dielectric material may be deposited by thermal evaporation, vacuum processing or lamination techniques as are known in the art. Alternatively, the dielectric material may be deposited from solution using, for example, spin coating or ink jet printing techniques and other solution deposition techniques discussed above.

If the dielectric material is deposited from solution onto the organic semiconductor, it should not result in dissolution of the organic semiconductor. Likewise, the dielectric material should not be dissolved if the organic semiconductor is deposited onto it from solution. Techniques to avoid such dissolution include: use of orthogonal solvents, that is use of a solvent for deposition of the uppermost layer that does not dissolve the underlying layer; and crosslinking of the underlying layer.

The thickness of the insulating layer is preferably less than 2 micrometres, more preferably less than 500 nm.

Further layers, other than those specifically mentioned herein, may be present in the TFT according to this invention.

A self assembled monolayer (SAM) may be deposited on the gate, source or drain electrodes, substrate, insulating layer and organic semiconductor material to promote crystallity, reduce contact resistance, repair surface characteristics and promote adhesion where required. In particular, the dielectric surface in the channel region may be provided with a monolayer comprising a binding region and an organic region to improve device performance, e.g. by improving the organic semiconductor's morphology (in particular polymer alignment and crystallinity) and covering charge traps, in particular for a high k dielectric surface. Exemplary materials for such a monolayer include chloro- or alkoxy-silanes with long alkyl chains, eg octadecyltrichlorosilane.

With reference to FIG. 3, the architecture of an electroluminescent device according to the invention comprises a transparent glass or plastic substrate 51, an anode 52 of indium tin oxide and a cathode 54. An electroluminescent layer 53 is provided between anode 52 and cathode 54.

Further layers may be located between anode 52 and cathode 53, such as charge transporting, charge injecting or charge blocking layers.

In particular, it is desirable to provide a conductive hole injection layer formed of a doped organic material located between the anode 52 and the electroluminescent layer 53 to assist hole injection from the anode into the layer or layers of semiconducting polymer. Examples of doped organic hole injection materials include polyethylene dioxythiophene) (PEDT), in particular PEDT doped with polystyrene sulfonate (PSS) as disclosed in EP 0901176 and EP 0947123, or polyaniline as disclosed in U.S. Pat. No. 5,723,873 and U.S. Pat. No. 5,798,170.

If present, a hole transporting layer located between anode 52 and electroluminescent layer 53 preferably has a HOMO level of less than or equal to 5.5 eV, more preferably around 4.8-5.5 eV.

If present, an electron transporting layer located between electroluminescent layer 53 and cathode 54 preferably has a LUMO level of around 3-3.5 eV.

Electroluminescent layer 53 may consist of the electroluminescent material alone or may comprise the electroluminescent material in combination with one or more further materials. In particular, the electroluminescent material may be blended with hole and/or electron transporting materials as disclosed in, for example, WO 99/48160. Alternatively, the electroluminescent material may be covalently bound to a charge transporting material. Suitable electroluminescent polymers for use in layer 53 include poly(arylene vinylenes) such as poly(p-phenylene vinylenes) and polyarylenes such as: polyfluorenes, particularly 2,7-linked 9,9 dialkyl polyfluorenes or 2,7-linked 9,9 diaryl polyfluorenes; polyspirofluorenes, particularly 2,7-linked poly-9,9-spirofluorene; polyindenofluorenes, particularly 2,7-linked polyindenofluorenes; polyphenylenes, particularly alkyl or alkoxy substituted poly-1,4-phenylene. Such polymers as disclosed in, for example, Adv. Mater. 2000 12(23) 1737-1750 and references therein.

Cathode 54 is selected from materials that have a workfunction allowing injection of electrons into the electroluminescent layer. Other factors influence the selection of the cathode such as the possibility of adverse interactions between the cathode and the electroluminescent material. The cathode may consist of a single material such as a layer of aluminium. Alternatively, it may comprise a plurality of metals, for example a bilayer of calcium and aluminium as disclosed in WO 98/10621, elemental barium disclosed in WO 98/57381, Appl. Phys. Lett. 2002, 81(4), 634 and WO 02/84759 or a thin layer of dielectric material to assist electron injection, for example lithium fluoride disclosed in WO 00/48258 or barium fluoride, disclosed in Appl. Phys. Lett. 2001, 79(5), 2001. In order to provide efficient injection of electrons into the device, the cathode preferably has a workfunction of less than 3.5 eV, more preferably less than 3.2 eV, most preferably less than 3 eV.

Optical devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device is preferably encapsulated with an encapsulant (not shown) to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142. A getter material for absorption of any atmospheric moisture and/or oxygen that may permeate through the substrate or encapsulant may be disposed between the substrate and the encapsulant.

In a practical device, at least one of the electrodes is semitransparent in order that light may be absorbed (in the case of a photoresponsive device) or emitted (in the case of an OLED). Where the anode is transparent, it typically comprises indium tin oxide. Examples of transparent cathodes are disclosed in, for example, GB 2348316.

The embodiment of FIG. 3 illustrates a device wherein the device is formed by firstly forming an anode on a substrate followed by deposition of an electroluminescent layer and a cathode, however it will be appreciated that the device of the invention could also be formed by firstly forming a cathode on a substrate followed by deposition of an electroluminescent layer and an anode.

A single polymer or a plurality of polymers may be deposited from solution to form layer 53. Suitable solvents for polyarylenes, in particular polyfluorenes, include mono- or poly-alkylbenzenes such as toluene and xylene. Particularly preferred solution deposition techniques are spin-coating and inkjet printing.

Spin-coating is particularly suitable for devices wherein patterning of the electroluminescent material is unnecessary—for example for lighting applications or simple monochrome segmented displays.

Inkjet printing is particularly suitable for high information content displays, in particular full colour displays. Inkjet printing of OLEDs is described in, for example, EP 0830303.

If multiple layers of the device are formed by solution processing then the skilled person will be aware of techniques to prevent intermixing of adjacent layers, for example by crosslinking of one layer before deposition of a subsequent layer or selection of materials for adjacent layers such that the material from which the first of these layers is formed is not soluble in the solvent used to deposit the second layer.

OTFTs according to the present invention have a wide range of possible applications.

The TFT of the present invention advantageously may be used as an alternative to a silicon transistor in any application thereof. The TFT of the present invention advantageously may be comprised in an RFID tag, a display device, or a sensor.

OTFTs according to the present invention may be used to drive pixels in an optical device, preferably an organic optical device. Examples of such optical devices include photoresponsive devices, in particular photodetectors, and light-emissive devices, in particular organic light emitting devices. OTFTs are particularly suited for use with active matrix organic light emitting devices, e.g. for use in display applications.

FIG. 4 shows a pixel comprising an organic thin film transistor and an adjacent organic light emitting device fabricated on a common substrate 20. The OTFT comprises gate electrode 22, dielectric layer 24, source and drain electrodes 23s and 23d respectively, and OSC layer 25. The OLED comprises anode 27, cathode 29 and an electroluminescent layer 28 provided between the anode and cathode. Further layers may be located between the anode and cathode, such as charge transporting, charge injecting or charge blocking layers. In the embodiment of FIG. 3, the layer of cathode material extends across both the OTFT and the OLED, and an insulating layer 26 is provided to electrically isolate the cathode layer 29 from the OSC layer 25. The active areas of the OTFT and the OLED are defined by a common bank material formed by depositing a layer of photoresist on substrate 21 and patterning it to define OTFT and OLED areas on the substrate.

In this embodiment, the drain electrode 23d is directly connected to the anode of the organic light emitting device for switching the organic light emitting device between emitting and non-emitting states.

In an alternative arrangement illustrated in FIG. 3, an organic thin film transistor may be fabricated in a stacked relationship to an organic light emitting device. In such an embodiment, the organic thin film transistor is built up as described above in either a top or bottom gate configuration. As with the embodiment of FIG. 3, the active areas of the OTFT and OLED are defined by a patterned layer of photoresist 33, however in this stacked arrangement, there are two separate bank layers 33—one for the OLED and one for the OTFT. A planarisation layer (also known as a passivation layer) is deposited over the OTFT. Exemplary passivation layers include BCBs and parylenes. An organic light emitting device is fabricated over the passivation layer. The anode 34 of the organic light emitting device is electrically connected to the drain electrode of the organic thin film transistor by a conductive via 32 passing through passivation layer 31 and bank layer 33.

It will be appreciated that pixel circuits comprising an OTFT and an optically active area (e.g. light emitting or light sensing area) may comprise further elements. In particular, the OLED pixel circuits of FIGS. 4 and 5 will typically comprise least one further transistor in addition to the driving transistor shown, and at least one capacitor.

It will be appreciated that the organic light emitting devices described herein may be top or bottom-emitting devices. That is, the devices may emit light through either the anode or cathode side of the device. In a transparent device, both the anode and cathode are transparent. It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium.

Transparent cathodes are particularly advantageous for active matrix devices because emission through a transparent anode in such devices may be at least partially blocked by OTFT drive circuitry located underneath the emissive pixels as can be seen from the embodiment illustrated in FIG. 5.

Example

Hole-only devices having the architecture shown in FIG. 6 with a green LEP were fabricated to compare untreated anodes with MoCr anodes that had undergone one of the following treatments after deposition:
1. untreated (a) ITO/PEDOT: PSS anode (b) MoCr anode
2. 10 minute oxygen plasma treatment (3 kW)
3. 1 minute RCA-1 clean
4. 10 minute UV—O3 treatment The devices were fabricated using standard deposition techniques. In FIG. 6, the following abbreviations have been used:
1. "Green 1302"—green light emitting electroluminescent polymer
2. "HT12 HTL": —hole transport layer
3. "ITO": Indium Tin Oxide
4. "PEDOT/PSS": poly(ethylenedioxythiophene)/polystyrene sulfonate.

Referring to FIG. 7, the untreated MoCr anode 1 showed very low current density compared to the treated MoCr anodes in devices 2, 3 and 4.

The invention claimed is:

1. A method of making a top-gate organic thin film transistor, comprising:
    (a) forming source and drain contacts on a substrate;
    (b) oxidizing portions of the source and drain contacts;
    (c) depositing an organic semiconductor layer to form a bridge between the oxidised portions of the source and drain contacts;
    (d) depositing a gate insulating layer over the organic semiconductor layer; and
    (e) forming a gate electrode over the gate insulating layer;
wherein the method comprises surface modification of the source and drain contacts by oxidizing the source and drain contacts in differing amounts, wherein step (b) occurs prior to step (c).

2. A method according to claim 1, wherein the source and drain contacts formed in (a) comprise at least one metal.

3. A method according to claim 2, wherein the thin film transistor is a p-channel thin film transistor and the source and drain contacts deposited in (a) comprise a metal with a work function in the range of from 4.5 eV to 5.5 eV.

4. A method according to claim 1, wherein the oxidized portions formed in (b) comprise an oxygen compound.

5. A method according to claim 4, wherein the oxidized portions comprise MoCr-oxide, $MoO_3$, $WO_3$, $V_2O_5$, oxides of Ag or Al, or alloy oxides of Al or Ag.

6. A method according to claim 1, wherein the thickness of the oxidized portions is in the range of 5 nm to 10 nm.

7. A method according to claim 1, wherein the organic semiconductor layer comprises a polymer.

8. A method according to claim 1, comprising depositing the organic semiconductor layer using spin coating, ink jet printing, or flood printing.

9. A top-gate organic thin film transistor comprising:
source and drain contacts disposed on a substrate;
an organic semiconductor layer;
a gate insulating layer disposed on the organic semiconductor layer; and
a gate electrode disposed on the gate insulating layer;
wherein the source and drain contacts comprise surface-modified oxidized portions;
wherein the organic semiconductor layer is disposed such that it bridges the oxidized portions of the source and drain contacts; and
wherein the thickness of the source contact oxidized portion is different from the thickness of the drain contact oxidized portion.

10. A thin film transistor according to claim 9, wherein the source and drain contacts comprise at least one metal.

11. A thin film transistor according to claim 9, wherein the thin film transistor is a p-channel thin film transistor and the source and drain contacts comprise a metal with a work function in the range of from 4.5 eV to 5.5 eV.

12. A thin film transistor according to claim 9, wherein the oxidized portions of the source and drain contacts comprise an oxygen compound.

13. A thin film transistor according to claim 12, wherein the oxidized portions comprise MoCr-oxide, $MoO_3$, $WO_3$ or $V_2O_5$.

14. A thin film transistor according to claim 9, wherein the thickness of the oxidized portions is in the range of 5 nm to 10 nm.

15. A thin film transistor according to claim 9, wherein the organic semiconductor layer comprises a polymer.

16. An RFID tag, a display device, or a sensor comprising a thin film transistor according to claim 9.

17. A device comprising a top-gate organic thin film transistor as defined in claim 9, wherein the device further comprises an organic light emitting device supported on the substrate.

18. A method of making a top-gate organic thin film transistor and an organic light emitting device on a single substrate, including the steps of:
    (a) forming source and drain contacts for the organic thin film transistor on a substrate;
    (b) forming an anode for the organic light emitting device on the substrate of step (a); and
    (c) oxidizing portions of the source and drain contacts and the anode formed in steps (a) and (b),
wherein the source and drain contacts are surface modified and oxidized in differing amounts.

19. A method according to claim 18, comprising forming the source and drain contacts and the anode in a single step.

* * * * *